US009859339B2

(12) United States Patent
Sun et al.

(10) Patent No.: US 9,859,339 B2
(45) Date of Patent: Jan. 2, 2018

(54) DISPLAY SUBSTRATE, MANUFACTURING METHOD AND DRIVING METHOD THEREOF, AND DISPLAY DEVICE

(71) Applicant: BOE TECHNOLOGY GROUP CO., LTD., Beijing (CN)

(72) Inventors: Hongda Sun, Beijing (CN); Xuyuan Li, Beijing (CN); Meili Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/307,090

(22) PCT Filed: Mar. 31, 2016

(86) PCT No.: PCT/CN2016/078068
§ 371 (c)(1),
(2) Date: Oct. 27, 2016

(87) PCT Pub. No.: WO2016/184265
PCT Pub. Date: Nov. 24, 2016

(65) Prior Publication Data
US 2017/0162629 A1 Jun. 8, 2017

(30) Foreign Application Priority Data
May 15, 2015 (CN) .......................... 2015 1 0250085

(51) Int. Cl.
H01L 27/32 (2006.01)
H01L 21/77 (2017.01)
(Continued)

(52) U.S. Cl.
CPC .............. H01L 27/32 (2013.01); H01L 21/77 (2013.01); H01L 51/52 (2013.01); H01L 51/56 (2013.01)

(58) Field of Classification Search
CPC ......... H01L 27/32; H01L 21/77; H01L 51/52; H01L 51/56; H01L 27/3246
See application file for complete search history.

(56) References Cited

U.S. PATENT DOCUMENTS

2003/0230747 A1* 12/2003 Ostergard ............... H01L 51/00
257/40
2016/0111688 A1* 4/2016 Lee .......................... H01L 51/56
257/40

FOREIGN PATENT DOCUMENTS

| CN | 101523631 A | 9/2009 |
| CN | 102709310 A | 10/2012 |
| CN | 104851906 A | 8/2015 |

OTHER PUBLICATIONS

English Translation of PCT (CN) International Search Report, Application No. PCT/CN2016/078068, dated Jul. 1, 2016, 2 pps.
(Continued)

Primary Examiner — Dung Le
(74) Attorney, Agent, or Firm — Armstrong Teasdale LLP

(57) ABSTRACT

A display substrate, a manufacturing method and a driving method thereof, and a display device are provided. The display substrate includes a substrate, a gate layer disposed on the substrate, a gate insulating layer disposed on the gate layer, a pixel defining layer disposed on the gate insulating layer, the pixel defining layer includes a plurality of defining regions, a light emitting layer in the defining regions of the pixel defining layer disposed on the gate insulating layer, wherein the light emitting layer includes an electron excitation layer, a light excitation layer and a hole excitation layer, and a source/drain layer disposed on the light emitting layer. According to an embodiment of the present disclosure, light emission and control of light emission can be realized merely by a three-layer structure of a gate layer, a light emitting layer and a source/drain layer, and compared with
(Continued)

the OLED light emitting structure of the prior art, the layer structure is simpler, the light emitted is less blocked, and luminous efficiency is higher.

13 Claims, 2 Drawing Sheets

(51) Int. Cl.
  *H01L 51/52* (2006.01)
  *H01L 51/56* (2006.01)

(56) References Cited

OTHER PUBLICATIONS

PCT (CN) Written Opinion, Application No. PCT/CN2016/078068, dated Jul. 1, 2016, 6 pps.: with English Translation.
China 1st Office Action, Application No. 201510250085.3, dated May 15, 2017, 15 pps.: with English translation.

* cited by examiner

DISPLAY SUBSTRATE, MANUFACTURING METHOD AND DRIVING METHOD THEREOF, AND DISPLAY DEVICE

CROSS REFERENCE TO RELATED APPLICATIONS

This application is a National Stage entry of PCT/CN2016/078068 filed Mar. 31, 2016, which claims priority to Chinese Patent Application No. 201510250085.3 filed on May 15, 2015, the disclosures of which are incorporated herein in their entirety as part of the present application.

BACKGROUND

Embodiments of the present disclosure relates to the field of display technology, and in particular, to a display substrate, a manufacturing method and a driving method thereof, and a display device.

In a conventional OLED display technology, whether a bottom emission type OLED or a top emission type OLED is used, the light emitting structure of connecting a thin film transistor (TFT) with an OLED in a display cell requires multiple layers such as a gate layer (GATE), a pixel defining layer (PDL), a light emitting layer (EL) and the like to achieve luminous effect.

BRIEF DESCRIPTION

An embodiment of the present disclosure provides a display substrate that emits light using an organic light emitting transistor to reduce the number of layers in the display substrate and improve the luminous efficiency.

According to a first aspect of the present disclosure, a display substrate is provided, which includes a substrate, a gate layer disposed on the substrate, a gate insulating layer disposed on the gate layer, a pixel defining layer disposed on the gate insulating layer, the pixel defining layer includes a plurality of defining regions, a light emitting layer in the defining regions of the pixel defining layer disposed on the gate insulating layer, the light emitting layer includes an electron excitation layer, a light excitation layer and a hole excitation layer, and a source/drain layer disposed on the light emitting layer.

In an embodiment of the present disclosure, the gate layer includes a transparent conductive layer, and a metal wire connected electrically with the transparent conductive layer.

In an embodiment of the present disclosure, when a first voltage applied to the transparent conductive layer has a level of greater than a first preset value, the light emitting layer is turned on, such that source and drain electrodes in the source/drain layer are turned on.

In an embodiment of the present disclosure, when the first voltage applied to the transparent conductive layer has a level of greater than the first preset value, and a second voltage applied to the source and drain electrodes has a level of greater than a second preset value, the light emitting layer emits light.

In an embodiment of the present disclosure, a material of the source/drain layer includes a reflective metal.

In an embodiment of the present disclosure, a ratio of an area of the source/drain layer covering the light emitting layer to an area of the light emitting layer is greater than a preset value.

In an embodiment of the present disclosure, the gate insulating layer includes a first insulating layer formed by a silicon nitride and/or a second insulating layer formed by a silicon oxide.

According to a second aspect of the present disclosure, a display device is also provided, which includes any one display substrate described as above.

According to a third aspect of the present disclosure, a driving method for a display substrate is also provided, which is used to drive any one display substrate described as above and includes applying a first voltage having level of greater than a first preset value to the gate layer, such that the light emitting layer is turned on, and applying a second voltage having level of greater than a second preset value to the source/drain layer, such that the light emitting layer emits light.

In an embodiment of the present disclosure, the method further including adjusting voltage values of the first and second voltages according to a first switching command to control turn-on or turn-off of the light emitting layer, and/or adjusting voltage values of the first and second voltages according to a second switching command to control a luminance of a light emitted from the light emitting layer.

According to a fourth aspect of the present disclosure, a manufacturing method for a display substrate is also provided, which includes forming a gate layer on a substrate, forming a gate insulating layer on the gate layer, forming a pixel defining layer on the gate insulating layer, the pixel defining layer comprising a plurality of defining regions, forming a light emitting layer in the defining regions of the pixel defining layer on the gate insulating layer, the light emitting layer comprising an electron excitation layer, a light excitation layer and a hole excitation layer, and forming a source/drain layer on the light emitting layer.

In an embodiment of the present disclosure, forming the gate layer on the substrate includes forming a transparent conductive layer, and forming a metal wire connected electrically with the transparent conductive layer.

In an embodiment of the present disclosure, forming the source/drain layer on the light emitting layer includes forming the source/drain layer according to an area of the light emitting layer, such that a ratio of an area of the source/drain layer covering the light emitting layer to an area of the light emitting layer is greater than a preset value.

In an embodiment of the present disclosure, forming the source/drain layer on the light emitting layer includes forming the source/drain layer on the light emitting layer by nanoimprinting.

In an embodiment of the present disclosure, forming the gate insulating layer on the gate layer includes forming a first insulating layer of a silicon nitride, and and/or forming a second insulating layer of a silicon oxide.

According to an embodiment of the present disclosure, on the one hand, the light emitting layer can function as a diode, and may be turned on when a voltage is applied through the transparent conductive layer, such that the source and drain electrodes may be turned on. On the other hand, the light emitting layer may emit light while the transparent conductive layer and the source/drain layer are respectively applied with a voltage. Since light emission and control of light emission can be realized merely by a three-layer structure of a gate layer, a light emitting layer and a source/drain layer, the layer structure is simpler, the light emitted is less blocked, and luminous efficiency is higher, compared with the light emitting structure of TFT connected with OLED in the prior art.

BRIEF DESCRIPTION OF THE DRAWINGS

The features and advantages of the present disclosure will be more clearly understood by reference to the drawings, which are schematic and are not to be construed as limiting the present disclosure, in which.

DETAILED DESCRIPTION

For a better understanding of the above and other objects, features and advantages of the present disclosure, the present disclosure will be described below in further detail with reference to the drawings and detailed description. It is to be noted that, in the case of no conflict, the features of the embodiments and the embodiments of the present disclosure may be combined with each other.

Numerous specific details are set forth in the following description, in order to provide a thorough understanding of the present disclosure, but the disclosure may be embodied in other specific manners other than those described herein. Thus, the scope of the disclosure is not limited by specific embodiments disclosed below.

Figure 1:
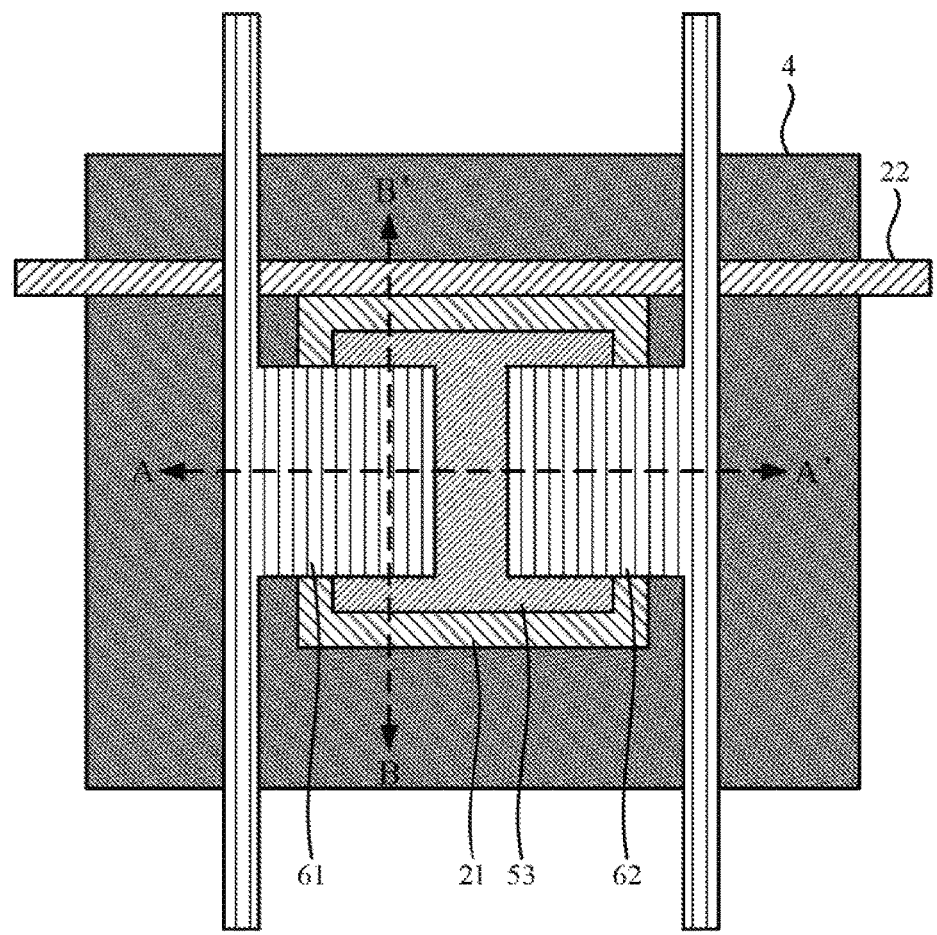
FIG. 1 is a structural schematic view showing a display substrate according to one embodiment of the present disclosure.
Figure 2:
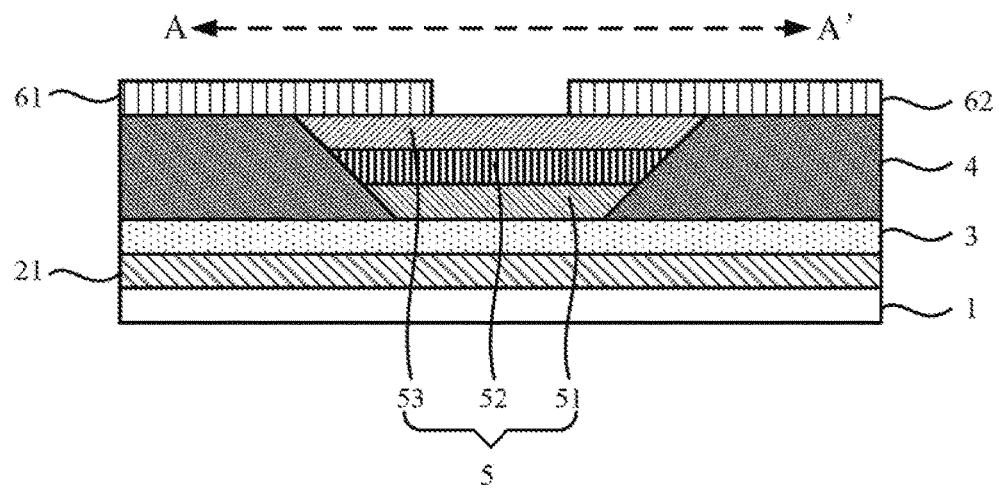
FIG. 2 is a schematic cross-sectional view showing the display substrate taken along line AA' in FIG. 1.
Figure 3:
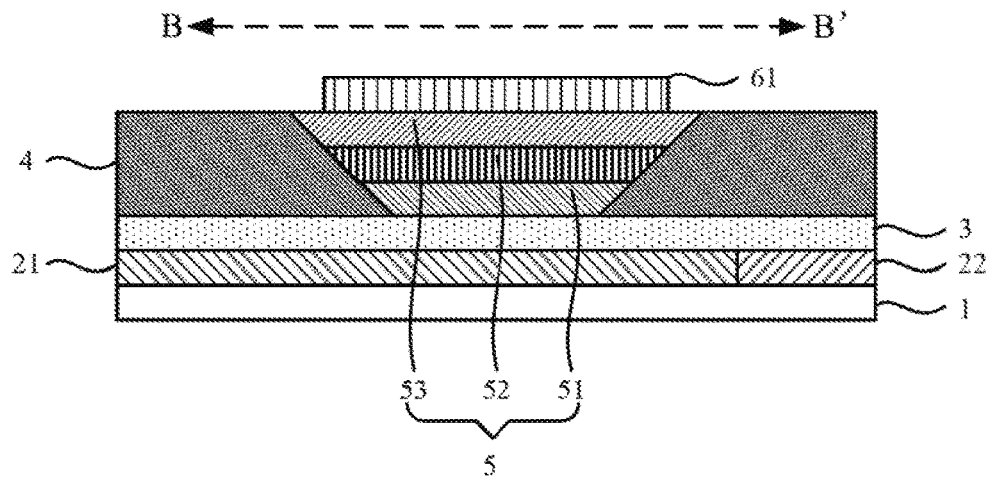
FIG. 3 is a schematic cross-sectional view showing the display substrate taken along line BB' in FIG. 1.

FIG. 1 is a structural schematic view showing a display substrate according to one embodiment of the present disclosure. FIG. 2 is a schematic cross-sectional view showing the display substrate taken along line AA' in FIG. 1. FIG. 3 is a schematic cross-sectional view showing the display substrate taken along line BB' in FIG. 1.

As shown in FIGS. 1 to 3, the display substrate according to one embodiment of the present disclosure includes a substrate 1, a gate layer disposed on the substrate 1, a gate insulating layer 3 disposed on the gate layer, a pixel defining layer 4 disposed on the gate insulating layer 3, the pixel defining layer includes a plurality of defining regions, a light emitting layer 5 in the defining regions of the pixel defining layer 4 disposed on the gate insulating layer 3, wherein the light emitting layer 5 includes an electron excitation layer 51, a light excitation layer 52 and a hole excitation layer 53, a source/drain layer disposed on the light emitting layer 5. Here, the hole excitation layer 53 is located at the uppermost portion of the light emitting layer 5, thus source/drain layer is disposed on the hole excitation layer 53.

In an embodiment of the present disclosure, on the one hand, the light emitting layer can emit light under the driving of the gate layer and the source/drain layer. On the other hand, the light emitting layer can function as a diode. When a certain voltage is applied to the gate layer, the light emitting layer is turned on, such that the source and drain electrodes in the source/drain layer may be turned on, thus the luminance of the light emitted from the light emitting layer can be controlled by passing a certain voltage through the signal line to the source/drain layer.

Light emission can be realized by only a three-layer structure of the gate layer, the light emitting layer and the source/drain layer, which incorporates a conventional connection structure of TFT and OLED. The light emitting layer of an embodiment of the present disclosure is located between the gate layer and source/drain layer, i.e., corresponding to the position of the active layer, functioning as not only an active layer but also an organic light emitting layer, thus it is possible to realize light emission with a structure having a small number of layers. Due to the structure of less layers, the emitted light is less blocked, and the luminous efficiency is improved. In an embodiment of the present disclosure, specifically, the luminous efficiency can be increased by 30%.

In an embodiment of the present disclosure, the material of the pixel defining layer may be a polyimide, which has not only an excellent light shielding effect but also an excellent insulating property, and can prevent the luminescent material from being dissipated.

As shown in FIG. 3, in an embodiment of the present disclosure, the gate layer includes a transparent conductive layer 21 disposed under the light emitting layer 5, and a metal wire 22 connected electrically with the transparent conductive layer 21.

In an embodiment of the present disclosure, when a first voltage applied to the transparent conductive layer 21 has a level of greater than a first preset value, the light emitting layer 5 is turned on, such that the source and drain electrodes 61 and 62 in the source/drain layer are turned on. Data lines connected electrically with the source and drain electrodes 61 and 62, respectively, are contained in the source/drain layer.

Compared with the OLED light emitting structure in the prior art, the metal wire 22 can function as a gate line (i.e., a scanning line), and the transparent conductive layer 21 can function as a gate electrode. The light emitting layer is turned on by applying a voltage to the transparent conductive layer 21, such that the source and drain electrodes 61 and 62 in the source/drain layer are turned on. The transparent conductive layer 21 may also function as a cathode for supplying a negative voltage to drive the light emitting layer to emit light and exciting the electron excitation layer 51 in the light emitting layer 5 to generate electrons. Accordingly, the source/drain layer functions as an anode in addition to controlling the light emitting layer to emit light, that is, the source/drain layer supplies a positive voltage to drive the light emitting layer to emit light, and excites the hole excitation layer 53 in the light emitting layer 5 to generate holes.

Accordingly, compared with the OLED light emitting structure in the prior art, the display substrate of an embodiment of the present disclosure may omit the layer structure of the cathode, the light emitting layer and the anode, and can ensure the normal driving and control of the light emitting layer, and light emission and control of light emission are realized with a structure having a small number of layers.

In an embodiment of the present disclosure, when the first voltage applied to the transparent conductive layer 21 has a level of greater than the first preset value, and a second voltage applied to the source and drain electrodes 61 and 62 has a level of greater than a second preset value, the first voltage excites the electron excitation layer 51 to generate electrons and the second voltage excites the hole excitation layer 53 to generate holes, wherein electrons enter the hole excitation layer 53 through the light excitation layer 52 to combine with holes, thereby exciting the light excitation layer 52 to generate photons, thus the light emitting layer 5 emits light.

It is to be noted that "greater than" mentioned in the embodiments of the present disclosure is referred to the absolute value, that is, if the first voltage is a negative voltage and the first preset value is −10V, the first voltage being greater than the first preset value means the absolute value of the first voltage being greater than 10V, and the same is true when the second voltage is a negative voltage.

In general, the first voltage may be a negative voltage such that the electrons in electron excitation layer 51 move in a direction away from the transparent conductive layer 21, and the second voltage may be a positive voltage such that the electrons in the hole excitation layer 53 enter the source/drain layer to generate holes, the electrons move to the hole excitation layer 53 under the driving of an electric field generated by the first voltage and the second voltage to fill part of the holes in the hole excitation layer 53. When the electrons pass through the light excitation layer 52, the light excitation layer 52 is excited to generate photons in which the direction of movement of the photons can be directed toward the transparent conductive layer 21 to effect the bottom emission.

In an embodiment of the present disclosure, the material of the source/drain layer may comprise a reflective metal (which may be for example a silver or an aluminum). On the basis of the bottom emission, the material of the source/drain layer is set as a reflective metal, such that most of the photons in the light excitation layer 52 which are directed to the source/drain layer are reflected and emitted from the transparent conductive layer 21, thereby enhancing the luminous efficiency of the bottom emission structure.

In an embodiment of the present disclosure, a ratio of the area of the source/drain layer covering the light emitting layer to the area of the light emitting layer 5 is greater than a preset value. As described above, since the source/drain layer needs to function as an anode in the OLED, it is necessary to cover a certain area of the light emitting layer 5 so as to excite the hole excitation layer 53 to generate holes well and form an uniform electric field with the transparent conductive layer 21, such that the electrons can pass through the light emitting excitation layer 52 in a movement track close to a straight line, so as to excite the light excitation layer 52 to generate photons well and achieve a good light emitting effect.

In an embodiment of the present disclosure, the gate insulating layer 3 includes a first insulating layer formed by a silicon nitride and/or a second insulating layer formed by a silicon oxide. The gate insulating layer is formed by a multi-layer insulating structure, which may ensure the light emitting layer 5 is insulated from the gate layer, and also may protect the light emitting layer from damage.

An embodiment of the present disclosure also provides a display device comprising any one display substrate described as above.

It is to be noted that the display device in the embodiments of the present disclosure may be any product or component having a display function such as an electronic paper, a mobile phone, a tablet computer, a television set, a notebook computer, a digital photo frame, a navigator or the like.

An embodiment of the present disclosure also provides a driving method for a display substrate is also provided, which is used to drive any one display substrate described as above and includes applying a first voltage having level of greater than a first preset value to the gate layer, such that the light emitting layer 5 is turned on and the electron excitation layer 51 is excited to generate electrons, and applying a second voltage having level of greater than a second preset value to the source/drain layer so as to excite the hole excitation layer 53 to generate holes, wherein the first voltage excites the electrons generated in the electron excitation layer 51 to enter the hole excitation layer 53 through the light excitation layer 52 to fill the holes, thereby exciting the light excitation layer 52 to generate photons, thus the light emitting layer 5 emits light.

The first voltage may be a negative voltage, and the electron excitation layer 51 may be excited to generate electrons when the gate layer is applied with the negative voltage. The second voltage may be a positive voltage, and when the source/drain layer is applied with the positive voltage, the electrons in the hole excitation layer 53 enter the source/drain layer, such that the hole excitation layer 53 is excited to generate holes. The electrons generated in the electron excitation layer 51 are negatively charged and move in the direction away from the transparent conductive layer 21 by the electric field formed by the source/drain layer and the gate layer, i.e. move toward the hole excitation layer 53, so as to fill part of holes in the hole excitation layer 53. When the electrons pass through the light excitation layer 52, the light excitation layer 52 may be excited to generate photons, thereby realizing the light emission of the light emitting layer 5.

In an embodiment of the present disclosure, the driving method further includes adjusting voltage values of the first and second voltages according to a first switching command to control a turn-on or turn-off of the light emitting layer 5, and by controlling the turn-on or turn-off of the light emitting layer 5, it is possible to realize the switching control of the corresponding pixel or sub-pixel. That is, it is possible to control the turn-on of the light emitting layer 5, while the light emitting layer 53 may not caused to emit light. For example, a lower negative voltage is applied to the electrode layer, while the source/drain layer is not applied with a positive voltage, then the light emitting layer 5 functioning as a diode still can be turned on, that is, a voltage exists only on two sides of the light emitting layer, while the electron excitation layer 51 does not generate electrons, and the hole excitation layer 53 does not generate holes.

Moreover, the driving method may further includes adjusting voltage values of the first and second voltages according to a second switching command to control the number of electrons passing through the light excitation layer 52 and further the number of photons emitted in the light excitation layer 52, thereby controlling the luminance of the light emitted from the light emitting layer.

For example, it is possible to increase the first voltage and the second voltage such that the electron excitation layer 51 generates more electrons and the hole excitation layer 53 generates more holes, thus the numbers thereof passing through the light excitation layer 52 are increased, and thus it is possible to excite the light excitation layer 52 to generate a larger number of photons, and the luminance of the light emitted from the light emitting layer 5 is increased.

Figure 4:
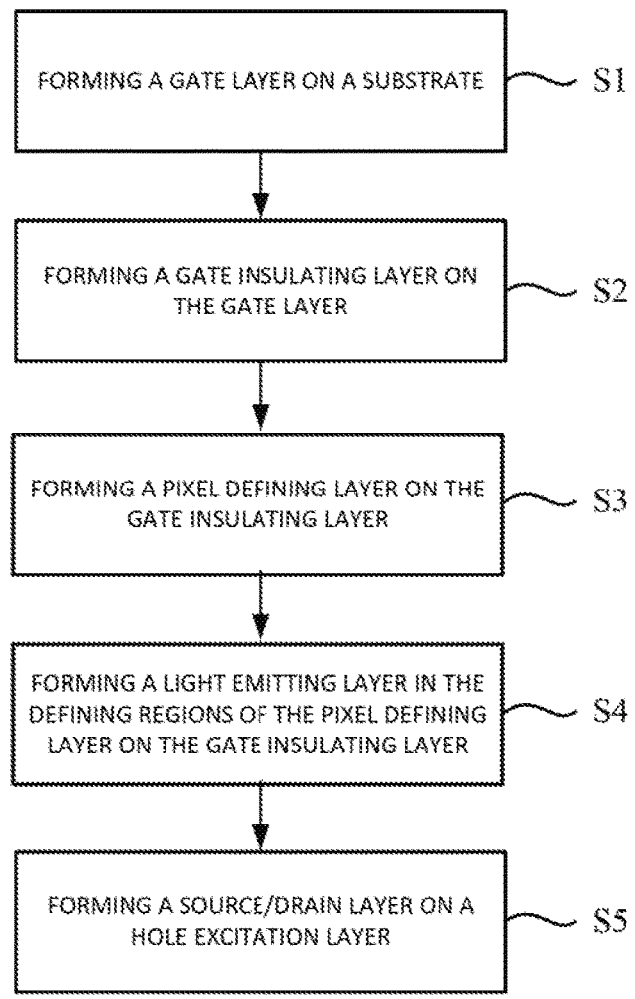
FIG. 4 is a schematic flowchart illustrating a manufacturing method of a display substrate according to one embodiment of the present disclosure.

FIG. 4 is a schematic flowchart illustrating a manufacturing method of a display substrate according to one embodiment of the present disclosure. As shown in FIG. 4, an embodiment of the present disclosure also provides a manufacturing method for a display substrate, which includes S1, forming a gate layer on a substrate 1, S2, forming a gate insulating layer 3 on the gate layer, S3, forming a pixel defining layer 4 on the gate insulating layer 3, wherein the pixel defining layer 4 includes a plurality of defining regions, S4, forming a light emitting layer 5 in the defining regions of the pixel defining layer 4 on the gate insulating layer 3, wherein the light emitting layer 5 includes an electron excitation layer 51, a light excitation layer 52 and a hole excitation layer 53, and S5, forming a source/drain layer on the light emitting layer 5. Here, the hole excitation layer 53 is located at the uppermost position of the light emitting layer 5, thus source/drain layer is formed on the hole excitation layer 53.

In an embodiment of the present disclosure, forming the gate layer on the substrate 1 includes forming a transparent conductive layer 21, wherein the light emitting layer 5 is formed on the transparent conductive layer 21, and forming a metal wire 22 connected electrically with the transparent conductive layer 21.

In an embodiment of the present disclosure, forming the source/drain layer on the hole excitation layer 53 includes forming the source/drain layer according to an area of the light emitting layer 5, such that a ratio of area of the source/drain layer covering the light emitting layer 5 to area of the light emitting layer 5 is greater than a preset value.

In an embodiment of the present disclosure, forming the source/drain layer on the hole excitation layer 53 includes forming the source/drain layer on hole excitation layer 53 by nanoimprinting. The source/drain layer prepared by the nanoimprint technique can ensure a sufficiently large forming area and have good conductivity, and the light emitting layer 5 may not be damaged when forming the source/drain layer.

In an embodiment of the present disclosure, forming the gate insulating layer 3 on the gate layer includes forming a first insulating layer of a silicon nitride; and/or forming a second insulating layer of a silicon oxide.

The forming process employed in the processes described as above may include, for example, a film forming process such as deposition, sputtering and the like, and a patterning process such as etching.

Embodiments of the present disclosure have been described above in detail with reference to the drawings. In the prior art, the light emitting structure of the OLED has a structure with a large number of layers. According to an embodiment of the present disclosure, light emission and control of light emission can be realized merely by a three-layer structure of a gate layer, a light emitting layer and a source/drain layer, and compared with the OLED light emitting structure of the prior art, the layer structure is simpler, the light emitted is less blocked, and luminous efficiency is higher.

It is to be noted that the dimensions of the layers and regions in the drawings may be exaggerated for clarity of illustration. It is also to be understood that when an element or layer is referred to as being "on" another element or layer, it may be directly on the other element, or intervening layers may be present. In addition, it will be understood that when an element or layer is referred to as being "under" another element or layer, it may be directly under the other element, or more than one intervening layer or element may be present. In addition, it will also be understood that when a layer or element is referred to as being "between" two layers or two elements, it may be a single layer between the two layer or two elements, or more than one intervening layer or element may be present. Like reference numerals refer to like elements throughout.

In the present disclosure, the terms "first" and "second" are used for purposes of illustration only and are not to be taken as an indication or suggestion of relative importance. The term "a plurality of" refers to two or more than two, unless otherwise specifically defined.

The foregoing are only example embodiments of the disclosure and are not intended to be limiting of the disclosure, and those skilled in the art will understand that various changes and modifications may be made therein. Any modifications, equivalent substitutions, improvements and the like within the spirit and principles of the disclosure are intended to be included within the scope of the disclosure.

What is claimed is:

1. A display substrate, comprising:
   a substrate;
   a gate layer disposed on the substrate, wherein the gate layer comprises a transparent conductive layer and a metal wire connected electrically with the transparent conductive layer;
   a gate insulating layer disposed on the gate layer;
   a pixel defining layer disposed on the gate insulating layer, the pixel defining layer comprising a plurality of defining regions;
   a light emitting layer in the defining regions of the pixel defining layer disposed on the gate insulating layer, the light emitting layer comprising an electron excitation layer, a light excitation layer, and a hole excitation layer; and
   a source/drain layer disposed on the light emitting layer.

2. The display substrate of claim 1, wherein the display substrate is configured such that when a first voltage applied to the transparent conductive layer has a level of greater than a first preset value, the light emitting layer is turned on, such that source and drain electrodes in the source/drain layer are turned on.

3. The display substrate of claim 2, wherein the display substrate is configured such that when the first voltage applied to the transparent conductive layer has a level of greater than the first preset value, and a second voltage applied to the source and drain electrodes has a level of greater than a second preset value, the light emitting layer emits light.

4. The display substrate of claim 1, wherein a material of the source/drain layer comprises a reflective metal.

5. The display substrate of claim 1, wherein a ratio of an area of the source/drain layer covering the light emitting layer to an area of the light emitting layer is greater than a preset value.

6. The display substrate of claim 1, wherein the gate insulating layer comprises at least one of a first insulating layer formed by a silicon nitride and a second insulating layer formed by a silicon oxide.

7. A display device, comprising the display substrate of claim 1.

8. A driving method for a display substrate, which is used to drive the display substrate of claim 1, the driving method comprising:
   applying a first voltage having a level of greater than a first preset value to the gate layer, such that the light emitting layer is turned on; and
   applying a second voltage having a level of greater than a second preset value to the source/drain layer, such that the light emitting layer emits light.

9. The driving method for a display substrate of claim 8, further comprising at least one of:
   adjusting voltage values of the first and second voltages according to a first switching command to control turn-on or turn-off of the light emitting layer; and
   adjusting voltage values of the first and second voltages according to a second switching command to control a luminance of a light emitted from the light emitting layer.

10. A manufacturing method for a display substrate, comprising:
    forming a gate layer on a substrate, the gate layer including a transparent conductive layer and a metal wire connected electrically with the transparent conductive layer;
    forming a gate insulating layer on the gate layer;

forming a pixel defining layer on the gate insulating layer, the pixel defining layer comprising a plurality of defining regions;

forming a light emitting layer in the defining regions of the pixel defining layer on the gate insulating layer, the light emitting layer comprising an electron excitation layer, a light excitation layer and a hole excitation layer; and forming a source/drain layer on the light emitting layer.

11. The manufacturing method for a display substrate of claim 10, wherein forming the source/drain layer on the light emitting layer comprises:

forming the source/drain layer according to an area of the light emitting layer, such that a ratio of an area of the source/drain layer covering the light emitting layer to an area of the light emitting layer is greater than a preset value.

12. The manufacturing method for a display substrate of claim 11, wherein forming the source/drain layer on the light emitting layer comprises:

forming the source/drain layer on the light emitting layer by nanoimprinting.

13. The manufacturing method for a display substrate of claim 10, wherein forming the gate insulating layer on the gate layer comprises at least one of:

forming a first insulating layer of a silicon nitride; and
forming a second insulating layer of a silicon oxide.

\* \* \* \* \*